(12) United States Patent
Werking

(10) Patent No.: US 8,823,450 B2
(45) Date of Patent: Sep. 2, 2014

(54) MULTIPLE-OUTPUT TRANSCONDUCTANCE AMPLIFIER BASED INSTRUMENTATION AMPLIFIER

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 78 days.

(21) Appl. No.: 13/553,503

(22) Filed: Jul. 19, 2012

(65) Prior Publication Data

US 2014/0022015 A1 Jan. 23, 2014

(51) Int. Cl.
*H03F 3/45* (2006.01)

(52) U.S. Cl.
CPC .......................................... *H03F 3/45* (2013.01)
USPC ........................................... 330/253; 330/258

(58) Field of Classification Search
CPC ............................... H03F 3/45183; H03F 3/45
USPC .................................................. 330/253, 258
See application file for complete search history.

(56) References Cited

U.S. PATENT DOCUMENTS

| | | | |
|---|---|---|---|
| 5,093,634 A | 3/1992 | Khoury | |
| 5,410,274 A | 4/1995 | Birdsall et al. | |
| 5,933,054 A | 8/1999 | Kimura | |
| 5,936,466 A | 8/1999 | Andoh et al. | |
| 6,084,461 A | 7/2000 | Colbeth et al. | |
| 6,107,856 A | 8/2000 | Bitting | |
| 6,538,513 B2 | 3/2003 | Godfrey et al. | |
| 7,193,466 B2 | 3/2007 | Kim et al. | |
| 7,301,398 B1 | 11/2007 | Allott et al. | |
| 7,327,189 B2 | 2/2008 | Regier | |
| 7,479,831 B2 | 1/2009 | Malone | |
| 7,557,651 B2 | 7/2009 | Corsi | |
| 7,671,686 B2 | 3/2010 | Kuo et al. | |
| 7,847,633 B2 | 12/2010 | Kinget | |
| 7,893,759 B1 | 2/2011 | Werking | |
| 8,035,422 B2 | 10/2011 | Wei | |
| 8,049,562 B2 | 11/2011 | Kumar et al. | |
| 8,081,030 B2 | 12/2011 | Werking | |
| 2010/0013537 A1 | 1/2010 | Eminoglu et al. | |
| 2010/0156385 A1 | 6/2010 | Werking | |
| 2011/0121902 A1 | 5/2011 | Wurcer et al. | |

OTHER PUBLICATIONS

Jaikla et al., "A Versatile Quadrature Oscillator and Universal Biquad Filter Using Dual-Output Current Controlled Current Differencing Transconductance Amplifier", IEEE, 2006, 4 pages.

Soliman, "Three Port Gyrator Circuits Using Transconductance Amplifiers or Generalized Conveyors", International Journal of Electronics and Comunications, 2011, 8 pages.

(Continued)

*Primary Examiner* — Robert Pascal
*Assistant Examiner* — Khiem Nguyen
(74) *Attorney, Agent, or Firm* — Shumaker & Sieffert, P.A.

(57) ABSTRACT

This disclosure is directed to devices and integrated circuits for instrumentation amplifiers. In one example, an instrumentation amplifier device uses two non-inverted outputs of a first multiple-output transconductance amplifier, and a non-inverted output and an inverted output of a second multiple-output transconductance amplifier. Both multiple-output transconductance amplifiers have a non-inverted output connected to an inverting input, and a non-inverting input connected to a respective input voltage terminal. A first resistor is connected between the inverting inputs of both multiple-output transconductance amplifiers. The outputs of both multiple-output transconductance amplifiers are connected together, connected through a second resistor to ground, and connected to an output voltage terminal. In other examples, two pairs of outputs from triple-output transconductance amplifiers are connected to provide two voltage output terminals, and may also be connected to buffers or a differential amplifier. These provide various advantages over traditional instrumentation amplifiers.

20 Claims, 7 Drawing Sheets

(56) References Cited

OTHER PUBLICATIONS

Al-Hashimi, et al., "Integrated Universal Biquad Based on Triple-Output OTAs and Using Digitally Programmable Zeros", downloadable from http://ieeexplore.ieee.org/xpls/abs_all.jsp?arnumber=694947, downloaded on Dec. 19, 2011, 1 page Jun. 1998.

Kimura, "The Ultra-Multi-Tanh Technique for Bipolar Linear Transconductance Amplifiers", downloadable from http://ieeexplore.ieee.org/xpls/abs_all.jsp?arnumber=563619, downloaded on Dec. 19, 2011, 3 pages Apr. 1997.

Al-Hashimi, "Current Mode Filter Structure Based on Dual Output Transconductance Amplifiers", downloadable from http://ieeexplore.ieee.org/xpls/abs_all.jsp?arnumber=490706, downloaded on Dec. 19, 2011, 1 page Jan. 196.

MULTIPLE-OUTPUT TRANSCONDUCTANCE AMPLIFIER BASED INSTRUMENTATION AMPLIFIER

This disclosure relates to integrated circuits, particularly to instrumentation amplifiers in integrated circuits.

BACKGROUND

Various applications, including in laboratory, industrial, and audio applications, for example, share the need to measure the difference between two relatively weak individual voltages superimposed with a potentially very large common voltage. Instrumentation amplifiers fill this need by rejecting the superimposed common voltage, i.e. common mode voltage, on two individual input voltages, and generating an output voltage that is directly proportional to the difference between the two individual input voltages. Thus, the output voltage, $V_{OUT}$, of an instrumentation amplifier is characterized by the operation of a common mode gain, $A_{CM}$, and a differential gain, $A_{DM}$, on the two input voltages, $V_1$ and $V_2$, according to equation 1.

$$V_{OUT} = A_{DM}(V_1 - V_2) + A_{CM}(V_1 + V_2)/2 \qquad \text{(Eq. 1)}$$

An ideal instrumentation amplifier has a constant differential gain and a common mode gain of zero. In practice, the common mode gain may not be zero but instead may be much less than the differential gain. An important measurement for instrumentation amplifiers is the common mode rejection ratio (CMRR), which is a ratio of the common mode gain to the differential gain expressed in decibels (dB). Typical instrumentation amplifiers may have CMRR in the range of 30 to 60 dB. The higher the CMRR, the closer an instrumentation amplifier is to ideal.

Typical instrumentation amplifiers are implemented using operational amplifiers and four or more resistors. The magnitude of resistance presented by particular resistors in the instrumentation amplifier dictates the gain of the amplifier. However, controlling the gain of these amplifiers through resistor selection is typically contingent upon matching a pair of resistors that have as close to identical resistance as is feasible. The difficulty and cost of fabricating an instrumentation amplifier may rise rapidly as greater precision is sought in matching the resistor pairs. For example, matching resistors above a certain level of precision typically requires an expensive process of using lasers for finely calibrated trimming of the resistors.

Resistors in instrumentation amplifiers may pose additional complications. For instance, the resistors may be implemented as polysilicon resistors that may have voltage coefficients that create significant distortion or non-linearity in the output voltage, even when resistor pairs are matched perfectly. Such voltage coefficients allow any common mode voltage to effectively modulate the output voltage by changing the differential gain.

SUMMARY

This disclosure is directed to devices, integrated circuits, and methods that may provide an instrumentation amplifier with great accuracy and common mode rejection, among other advantages.

In one example, a device includes a first multiple-output transconductance amplifier, a second multiple-output transconductance amplifier, a first resistor, a second resistor, and a first output voltage terminal. The first multiple-output transconductance amplifier includes a non-inverting input, an inverting input, a first non-inverted output, and a second non-inverted output. The first non-inverted output is connected to the inverting input, and the non-inverting input is connected to a first input voltage terminal. The second multiple-output transconductance amplifier includes a non-inverting input, an inverting input, a first non-inverted output, and an inverted output. The first non-inverted output is connected to the inverting input, and the non-inverting input is connected to a second input voltage terminal. A first end of the first resistor is connected to the inverting input of the first multiple-output transconductance amplifier, and a second end of the first resistor is connected to the inverting input of the second multiple-output transconductance amplifier. A first end of the second resistor is connected to both the second non-inverted output of the first multiple-output transconductance amplifier and the inverted output of the second multiple-output transconductance amplifier. A second end of the second resistor is connected to ground if the first end of the second resistor has a non-inverted input, or to an amplifier output node of an amplifier if the first end of the second resistor has an inverted input. The first output voltage terminal is connected to both the second non-inverted output of the first multiple-output transconductance amplifier and the inverted output of the second multiple-output transconductance amplifier.

In another example, an integrated circuit includes a first triple-output transconductance amplifier, a second triple-output transconductance amplifier, a first node, a second node, a first resistor, a second resistor, a third resistor, a first output voltage terminal, and a second output voltage terminal. The first triple-output transconductance amplifier includes a non-inverting input, an inverting input, a first non-inverted output, a second non-inverted output, and an inverted output. The first non-inverted output is connected to the inverting input. The second triple-output transconductance amplifier includes a non-inverting input, an inverting input, a first non-inverted output, a second non-inverted output, and an inverted output. The first non-inverted output is connected to the inverting input. The first node is connected to both the second non-inverted output of the first multiple-output transconductance amplifier and the inverted output of the second multiple-output transconductance amplifier. The second node is connected to both the inverted output of the first multiple-output transconductance amplifier and the second non-inverted output of the second multiple-output transconductance amplifier. The first resistor is connected to the non-inverting inputs of the first and second triple-output transconductance amplifiers. A first end of the second resistor is connected to the first node, and a first end of the third resistor is connected to the second node. The second ends of the second and third resistors are connected to the output signal return reference voltage or ground. The first output voltage terminal is downstream of the first node, and the second output voltage terminal is downstream of the second node.

Further embodiments include the above amplifiers having buffers on some or all of the input and output voltage lines. These buffers may comprise operational amplifiers and may apply voltage gains and phase delay responses to those voltage lines. The voltage gains may be matched across the input buffers and may equal unity. Additionally, the phase delay response may be matched across the input buffers.

The details of one or more examples are set forth in the accompanying drawings and the description below. Other features, objects, and advantages will be apparent from the description and drawings, and from the claims.

DETAILED DESCRIPTION

Various examples described herein may be directed to devices and integrated circuits for an instrumentation amplifier based on multiple-output transconductance amplifiers. In particular, many examples disclosed herein implement an instrumentation amplifier based on triple-output transconductance amplifiers ("TOTAs"). Triple-output transconductance amplifiers provide three outputs of substantially the same amplitude or magnitude of current, in which two of the outputs are non-inverted, i.e., have a non-inverted polarity, while the third output is inverted, i.e., has an inverted polarity. That is, a triple-output transconductance amplifier provides three current outputs $I_{OUT1}$, $I_{OUT2}$, $I_{OUT3}$ where $-I_{OUT3}=I_{OUT1}=I_{OUT2}$. Implementing an instrumentation amplifier based on triple-output transconductance amplifiers or other multiple-output transconductance amplifiers as disclosed herein may provide great accuracy and rejection of common-mode signals, among other advantages.

Figure 1:
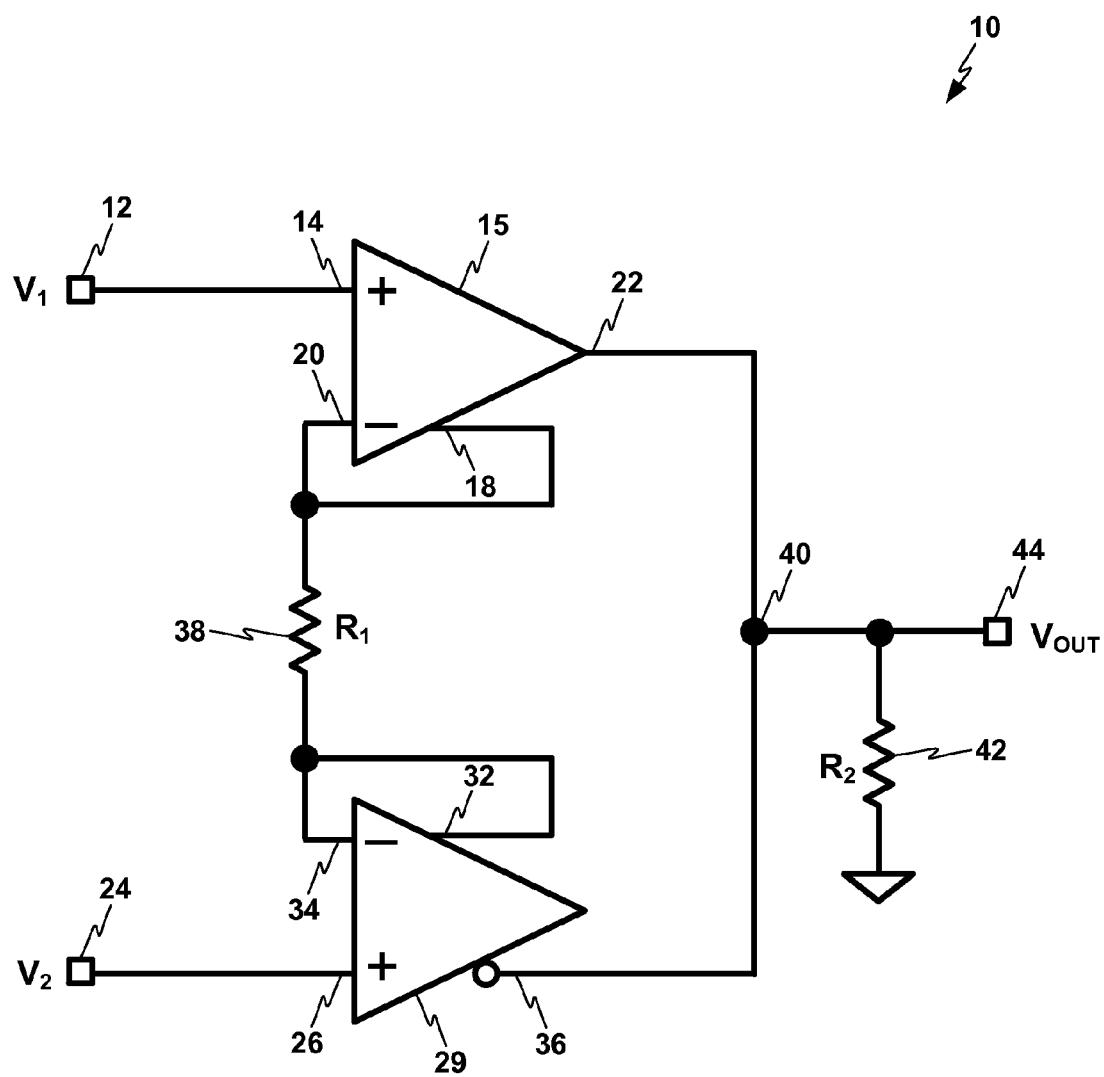
FIG. 1 is a circuit diagram of an instrumentation amplifier implemented with two dual output transconductance amplifiers, in accordance with an illustrative embodiment of this disclosure.

FIG. 1 is a circuit diagram of an example instrumentation amplifier 10 implemented with two multiple-output transconductance amplifiers ("MOTAs") 15 and 29. A "multiple-output transconductance amplifier" as used herein is a term that generically refers to any transconductance amplifier with more than one output, and which may be implemented as a double-output transconductance amplifier ("DOTA") or as a triple-output transconductance amplifier ("TOTA"). MOTAs 15 and 29 are implemented as DOTAs in the embodiment shown in FIG. 1, in which DOTA 15 has two non-inverted outputs and DOTA 29 has one non-inverted output and one inverted output. MOTAs 15 and 29 may also be implemented as triple-output transconductance amplifiers ("TOTAs") in other examples, in which instrumentation amplifier 10 uses the two non-inverted outputs of multiple-output transconductance amplifier 15 and the inverted output and one of the non-inverted outputs of multiple-output transconductance amplifier 29.

Depending on the techniques used in various implementations, it may be simpler or easier to implement both MOTAs 15 and 29, and potentially also other amplifier elements of an integrated circuit, as TOTAs. This may enable the use of a single type of MOTA for a variety of functions, including the function of both types of DOTA 15 and 29, which may reduce complexity of library infrastructure costs, for example. In other examples, implementing MOTAs 15 and 29 as specific types of DOTAs, one with two non-inverted outputs and one with one non-inverted output and one inverted output, may provide compelling advantages.

The example of FIG. 1, among further examples discussed below, may function as an instrumentation amplifier, in that the elements shown in instrumentation amplifier 10 may serve as an amplifier network that provides an output voltage $V_{OUT}$ at output terminal 44 that is proportional to the voltage difference between two input voltages $V_1$ at input terminal 12 and $V_2$ at input terminal 24.

In particular, in instrumentation amplifier 10, DOTA 15 has a non-inverting input 14, an inverting input 20, a first non-inverted output 18, and a second non-inverted output 22. The non-inverting input 14 of DOTA 15 is connected to first input voltage terminal 12. The first non-inverted output 18 is connected to the inverting input 20, by which means, DOTA 15 also functions as a type 2 current conveyer ("CCII"). As such, the voltage inputs of inverting input 20 may be substantially equal to the voltage at non-inverting input 14, the current through resistor 38 (with resistance R1) may be substantially equal to the matched current of the two non-inverted outputs 18 and 22, and the current at the inputs 14 and 20 may be substantially zero.

The second DOTA 29 has a non-inverting input 26, an inverting input 34, a first non-inverted output 32, and an inverted output 36, as indicated in the diagram of FIG. 1. The non-inverting input 26 of DOTA 29 is connected to second input voltage terminal 24. The first non-inverted output 32 is connected to the inverting input 34, by which means, DOTA 29 also functions as a type 2 current conveyer ("CCII").

Instrumentation amplifier 10 also includes a first resistor 38 with resistance $R_1$. A first end of first resistor 38 is connected to the inverting input 20 of the first DOTA 15, and a second end of the first resistor 38 is connected to the inverting input 34 of the second DOTA 29.

The second non-inverted output 22 of the first DOTA 15 and the inverted output 36 of the second DOTA 29 are connected together through node 40. Instrumentation amplifier 10 also includes a second resistor 42 with resistance $R_2$. A first end of second resistor 42 is connected through node 40 to both the second non-inverted output 22 of the first DOTA 15 and the inverted output 36 of the second DOTA 29. The second end of the second resistor 42 is connected to ground and twice as much current flows through resistor 42 as flows through resistor 38.

Instrumentation amplifier 10 also includes a first output voltage terminal 44 with voltage $V_{OUT}$. First output voltage terminal 44 is connected to both the second non-inverted output 22 of the first DOTA 15 and the inverted output 36 of the second DOTA 29.

Figure 2:
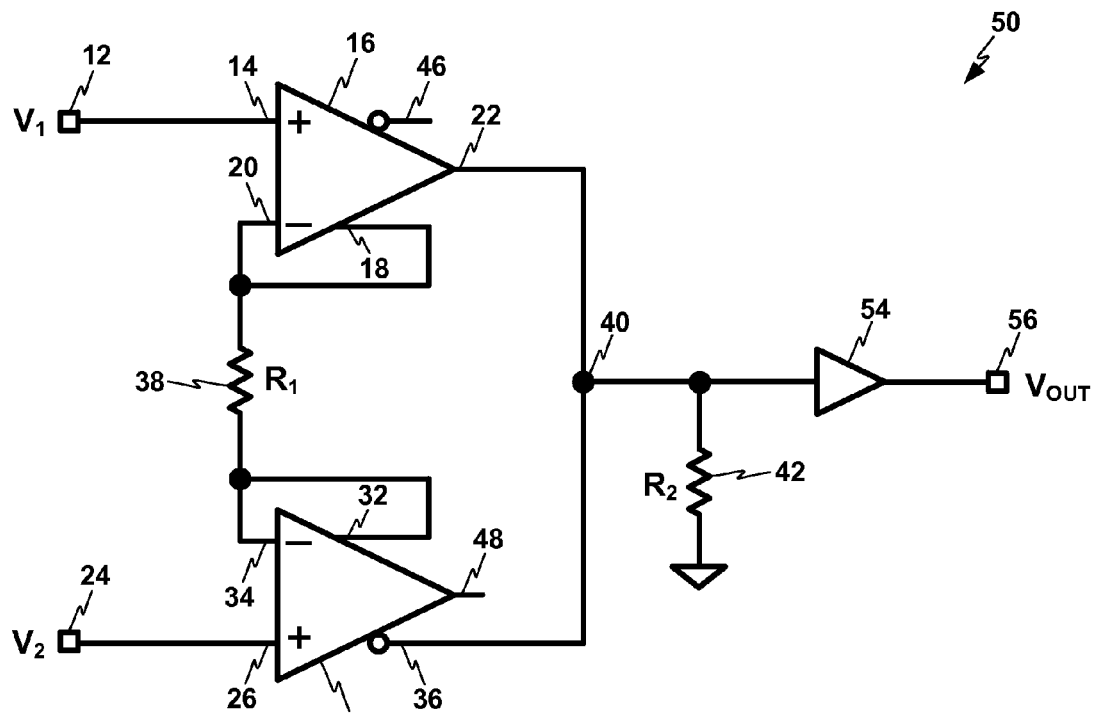
FIG. 2 is a circuit diagram of an instrumentation amplifier implemented with two triple-output transconductance amplifiers and a non-inverting output buffer, in accordance with another illustrative embodiment of this disclosure.
Figure 3:
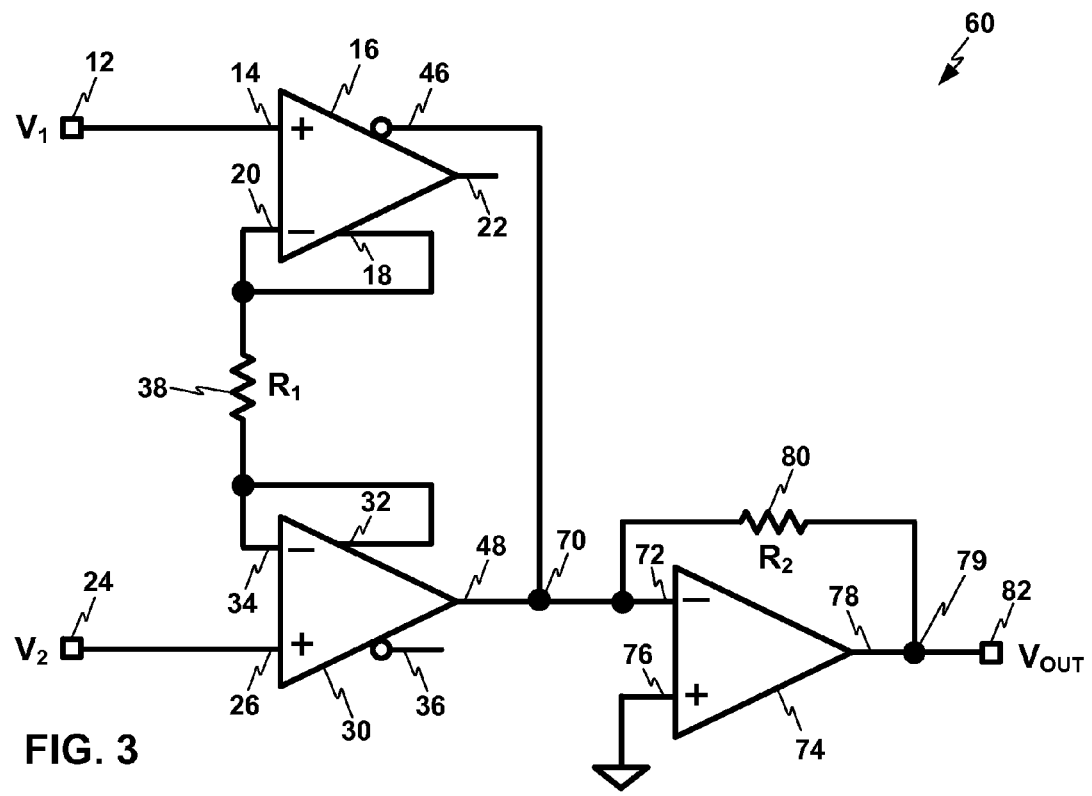
FIG. 3 is a circuit diagram of an instrumentation amplifier implemented with two triple-output transconductance amplifiers and an inverting output buffer, in accordance with another illustrative embodiment of this disclosure.

Instrumentation amplifier 10 may thereby provide a very clear reading through voltage $V_{OUT}$ of differences in voltage between input voltages $V_1$ and $V_2$ that may be very small relative to the voltage itself of input voltages $V_1$ and $V_2$. That is, instrumentation amplifier 10 may provide a clear reading of the differential voltage between input voltages $V_1$ and $V_2$ even when the differential voltage is very weak relative to the common mode voltage of input voltages $V_1$ and $V_2$. Furthermore, instrumentation amplifier 10 may serve this function with a number of advantages over typical instrumentation amplifiers, as discussed below, after briefly introducing FIGS. 2 and 3. FIGS. 2 and 3 depict variations on instrumentation amplifier 10 that may also provide further advantages in some settings.

FIG. 2 is a circuit diagram of an instrumentation amplifier 50 implemented with two triple-output transconductance amplifiers ("TOTAs") 16 and 30. Much of instrumentation amplifier 50 is similar to instrumentation amplifier 10 of FIG. 1. While DOTAs 15 and 29 of FIG. 1 may also be implemented as TOTAs, as discussed above, FIG. 2 explicitly shows analogous elements implemented as TOTAs 16 and 30 each having two non-inverted outputs and one inverted output.

TOTA 16 has all the same elements as DOTA 15 of FIG. 1 but is also depicted with inverted output 46, which is unused in instrumentation amplifier 50. Similarly, TOTA 30 has all the same elements as DOTA 29 of FIG. 1 but is also depicted with a second non-inverted output 48, which is unused in instrumentation amplifier 50. While inverted output 46 of first TOTA 16 and second non-inverted output 48 of second TOTA 30 are unused in the implementation of FIG. 2, TOTAs 16 and 30 may be identical elements, which may provide for simpler implementation and reduced library infrastructure costs, in some examples. Additionally, inverted output 46 of first TOTA 16 and second non-inverted output 48 of second TOTA 30 may also be used to provide additional advantages, as disclosed below with reference to subsequent figures.

Instrumentation amplifier 50 of FIG. 2 also includes an output buffer 54 between node 40 and output voltage terminal 56 (which is assigned a separate reference number from output voltage terminal 44 of FIG. 1 to indicate that the output it receives is conditioned by a different upstream circuit configuration than in FIG. 1). Output buffer 54 may be configured as a conventional single-output operational transconductance amplifier ("OTA") or an operational amplifier, for example.

FIG. 3 is a circuit diagram of an instrumentation amplifier 60 also implemented with two TOTAs 16 and 30. Instrumentation amplifier 60 also includes amplifier 74, which may be either an operational amplifier or an OTA, and is configured as an inverting buffer, as opposed to non-inverting buffer 54. Instrumentation amplifier 60 also uses inverted output 46 of first TOTA 16 and second non-inverted output 48 of second TOTA 30, in this example. Inverted output 46 of first TOTA 16 and second non-inverted output 48 of second TOTA 30 are connected via node 70 to inverting input 72 of amplifier 74, while non-inverting input 76 of amplifier 74 is connected to ground. Output 78 of amplifier 74 is connected through amplifier output node 79 to feedback resistor 80 which has resistance $R_2$. The other end of feedback resistor 80 is connected to the virtual ground at inverting input 72 of amplifier 74. Therefore, in the case of both resistor 80 of FIG. 3 and resistor 42 of FIGS. 1 and 2, resistors 42 and 80 each form a second resistor of which the first end is connected to both the non-inverted output of one of the DOTAs or TOTAs and the inverted output of the other one of the DOTAs or TOTAs, and the second end is connected to ground or to an output node. In particular, the second end of this second resistor is connected to ground in the case where the first end of this second resistor is connected to non-inverted output 22 of first DOTA 15 or first TOTA 16, as for resistor 42 in FIGS. 1 and 2, while the second end of this second resistor is connected to the output of an inverter in the case where the first end of this second resistor is connected to inverted input 22 of first TOTA 16, as for resistor 80 of FIG. 3. In either case, the instrumentation amplifier may be configured with an output buffer, i.e., output buffer 56 for instrumentation amplifier 50, or amplifier 74 configured as an output buffer for instrumentation amplifier 60. Output 78 of amplifier 74 is also connected to output voltage terminal 82 which has output voltage $V_{OUT}$.

Instrumentation amplifiers 10, 50, and 60 of FIGS. 1-3 may provide a number of substantial advantages over typical instrumentation amplifiers. For example, known instrumentation amplifiers typically include four or more resistors, including one or more pairs of resistors that must be matched in resistance, with the common mode rejection (CMR) of the instrumentation amplifier constrained by the precision of this matching. In contrast, each of instrumentation amplifiers 10, 50, and 60 of FIGS. 1-3 includes only two resistors, and the two resistors are at different stages and have no need to be matched to provide excellent CMR.

Resistors 38 and 42 may be discrete resistive elements in this example. Resistors 38 and 42 may be composed of polysilicon, TaN, CrSi, CrSiN, SiCCr, or other suitable resistive materials.

Instrumentation amplifier 10 of FIG. 1 without any output buffer may be advantageous when the output is lightly loaded. Instrumentation amplifier 50 of FIG. 2 may provide additional advantage when the output is heavily loaded. Instrumentation amplifier 60 of FIG. 3 may provide further advantage and may be easier to implement because amplifier 74 does not require a rail-to-rail input stage. Instrumentation amplifier 10 of FIG. 1 may be the most economical of these three examples to implement in applications where its use is feasible.

Additionally, all three instrumentation amplifiers 10, 50, and 60 of FIGS. 1-3 may share a number of advantages. Instrumentation amplifiers 50 and 60 may have very low output impedance. By adding outputs from two parallel current conveyors, each of instrumentation amplifiers 10, 50, and 60 provides double the output current, and double the differential gain without adding a resistor. Instrumentation amplifiers 10, 50, and 60 may all have low noise for their voltage gain because the output current combines the outputs from two different amplifiers in parallel so their noise is uncorrelated. Instrumentation amplifiers 10, 50, and 60 may also provide excellent frequency response because they only have a single stage of parallel current conveyors. Each of instrumentation amplifiers 10 and 50 may also consume lower amounts of power and chip area relative to typical instrumentation amplifiers.

The output voltage $V_{OUT}$ for all three instrumentation amplifiers 10, 50, and 60 follow the transfer function described by equation 1 where the differential gain $A_{DM}$ is as follows.

$$A_{DM}=2R_2/R_1 \tag{Eq. 2}$$

The common mode gain $A_{CM}$ depends on the amplifier input stage transistors and is typically less than 0.0001 (about $1/g_m r_0$) for a well-designed amplifier.

Figure 4A:
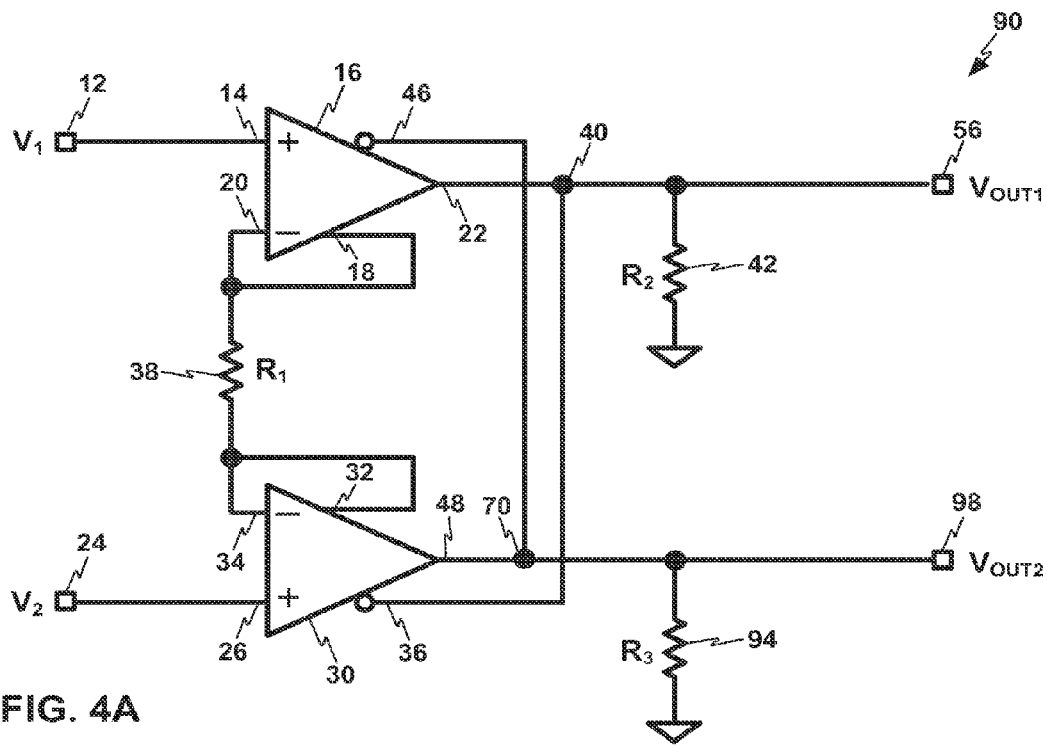
FIG. 4A is a circuit diagram of an instrumentation amplifier implemented with two triple-output transconductance amplifiers and two outputs, in accordance with an illustrative embodiment of this disclosure.
Figure 4B:
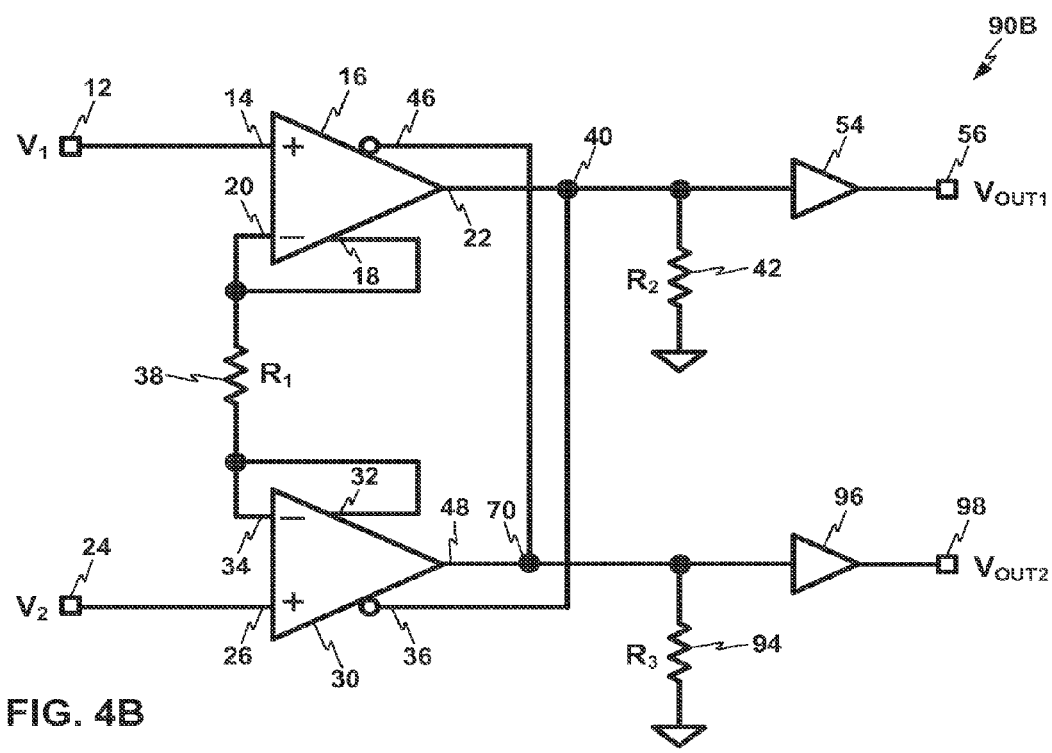
FIG. 4B is a circuit diagram of an instrumentation amplifier implemented with two triple-output transconductance amplifiers and two outputs with non-inverting buffers, in accordance with an illustrative embodiment of this disclosure.
Figure 5:
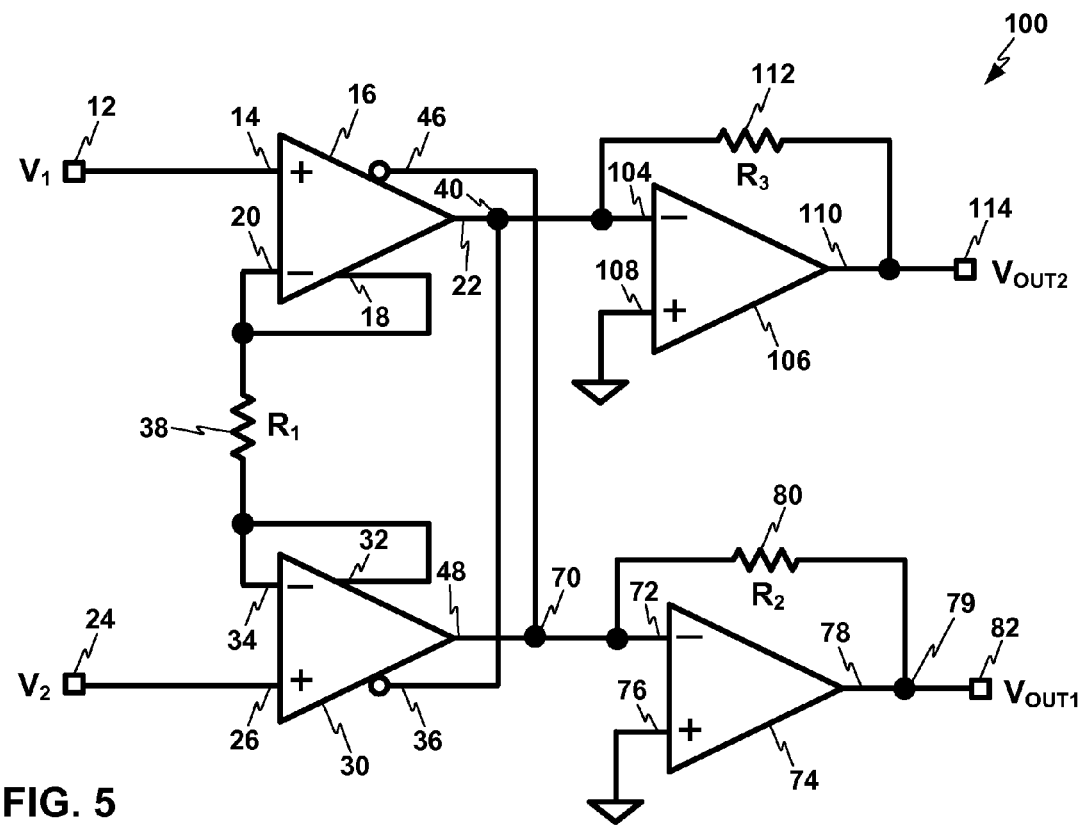
FIG. 5 is a circuit diagram of an instrumentation amplifier implemented with two triple-output transconductance amplifiers and two outputs with inverting buffers, in accordance with another illustrative embodiment of this disclosure.

FIG. 4A is a circuit diagram of example instrumentation amplifier 90 implemented with two TOTAs 16 and 30 and two outputs. FIG. 4B is a circuit diagram of example instrumentation amplifier 90B implemented with two TOTAs 16 and 30 and two outputs with non-inverting buffers 54 and 96. FIG. 5 is a circuit diagram of another example instrumentation amplifier 100 implemented with two TOTAs 16 and 30 and two outputs with amplifiers 106 and 74, which are either operational amplifiers or OTAs, and are configured as inverting buffers. Elements of these examples shared in common with those of FIGS. 1-3 have the same reference numbers.

While the examples of FIGS. 1 and 2 use one pair of one non-inverted output and one inverted output each from respective DOTAs or TOTAs 15/16 and 29/30, and the example of FIG. 3 uses the other potential pair of one non-inverted output and one inverted output each from respective TOTAs 16 and 30, the examples of FIGS. 4A, 4B, and 5 make use of both pairs at the same time to provide two outputs at output voltages VOUT1 and VOUT2. That is, instrumentation amplifiers 90, 90B, and 100 each use the combined output, through node 40, of non-inverted output 22 of first TOTA 16 and inverted output 36 of second TOTA 30, for one output, as in FIG. 2, while instrumentation amplifiers 90, 90B, and 100 also use the combined output, through node 70, of non-inverted output 48 of second TOTA 30 and inverted output 46 of first TOTA 16, for another output, as in FIG. 3.

Instrumentation amplifiers 90, 90B, and 100 may therefore serve as differential amplifiers in which each of the two outputs has twice the gain of an output in a typical differential amplifier that is not combined from one inverted output and one non-inverted output of two different, parallel, uncorrelated transconductance amplifiers, with all of the advantages described above. The output voltages $V_{OUT1}$ and $V_{OUT2}$ for all instrumentation amplifiers 90, 90B, and 100 follow the transfer function described by equation 3 below, where common-mode gain $A_{CM}$ is neglected for simplicity.

$$V_{OUT1}-V_{OUT2}=[2(R_2+R_3)/R_1](V_1-V_2) \tag{Eq. 3}$$

Additionally, in the special case where $R_2=R_3$, equation 3 reduces to equation 4.

$$V_{OUT1}-V_{OUT2}=4(R_2/R_1)(V_1-V_2) \tag{Eq. 4}$$

In instrumentation amplifier 90B of FIG. 4B, the combined output through node 40 is sent through a non-inverting buffer 54 to output voltage terminal 56, as in FIG. 2. The combined output through node 70 is also sent through a non-inverting buffer 96 to output voltage terminal 98, and is also connected to a resistor 94 that is grounded on the other end. In instrumentation amplifier 100 of FIG. 5, the combined output through node 70 is sent through amplifier 74, which may be an operational amplifier or an OTA and which is configured as an inverting buffer to output voltage terminal 82, as depicted in FIG. 3 and as described in reference thereto.

In instrumentation amplifier 100, the combined output through node 40 is also sent through an amplifier 106, which may be an operational amplifier or an OTA, and is configured as an inverting buffer to second output voltage terminal 114. Similarly, amplifier 106 receives the combined input from node 40 through inverting input 104, while non-inverting input 108 is connected to ground, and output 110 is connected through a resistor 112 back to inverting input 104, and output 110 is also connected to a second voltage output 114, which is at a second output voltage $V_{OUT2}$.

In variations of any of instrumentation amplifiers 90, 90B, and 100, either one of the outputs may or may not use a buffer, or an inverting buffer or non-inverting buffer, independently of the other output, as suitable for the design requirements of the outputs. Instrumentation amplifier 90B may require rail-to-rail inputs to the output buffers 54 and 96 in applications that do not involve driving high-impedance loads.

Instrumentation amplifiers 90, 90B, and 100 may provide twice as much signal and a superior signal-to-noise ratio compared with a differential amplifier that does not use combined outputs from two amplifier outputs for each of its outputs. In one representative example, using the two combined outputs of the instrumentation amplifier may cause the signal-to-noise ratio to be about three dB higher than the single-output instrumentation amplifier 60 of FIG. 3, which itself has about three dB less noise than a conventional single-output instrumentation amplifier which uses only one output from one of the amplifiers.

Figure 6:
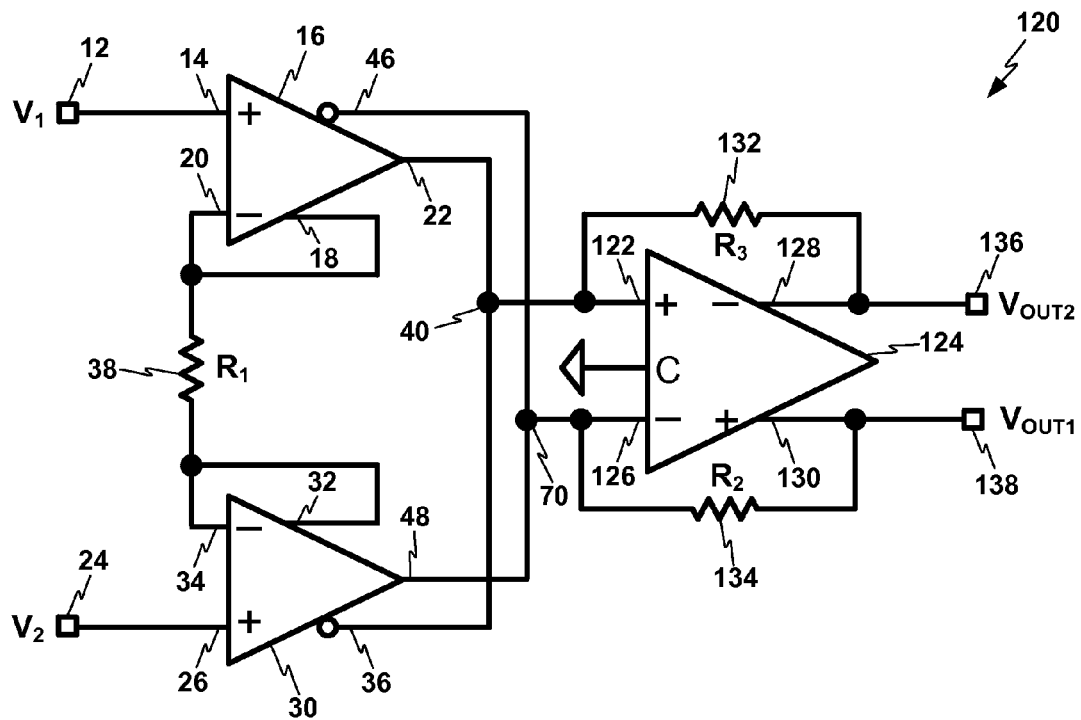
FIG. 6 is a circuit diagram of an instrumentation amplifier implemented with two triple-output transconductance amplifiers, a differential amplifier, and two outputs, in accordance with an illustrative embodiment of this disclosure.

FIG. 6 is a circuit diagram of example instrumentation amplifier 120 implemented with two TOTAs 16 and 30, a differential amplifier 124, and two outputs through voltage output terminals 136 and 138. The first stage of instrumentation amplifier 120 includes the non-inverted output 22 from first TOTA 16 and the inverted output 36 from second TOTA 30 combined through node 40, and the non-inverted output 48 from second TOTA 30 and the inverted output 46 from first TOTA 16 combined through node 70, just as in FIGS. 4A and 5. The combined output from node 40 is connected to non-inverting input 122 of differential amplifier 124, and the combined output from node 70 is connected to inverting input 126 of differential amplifier 124.

First output 130 of differential amplifier 124 is connected to inverting input 126 of differential amplifier 124 through second resistor 134 which has resistance $R_2$, and second output 128 of differential amplifier 124 is connected to non-inverting input 122 of differential amplifier 124 through third resistor 132 which has resistance $R_3$. First output 130 of differential amplifier 124 is also connected to first output voltage terminal 138 which has output voltage $V_{OUT1}$, and second output 128 of differential amplifier 124 is also connected to second output voltage terminal 136 which has output voltage $V_{OUT2}$. The outputs 130 and 128 from differential amplifier 124 thereby serve as the outputs from instrumentation amplifier 120. The outputs of instrumentation amplifier 120 may also be characterized by the transfer functions of equations 3 and 4.

By running both outputs of the first stage, i.e. the combined output from node 40 and the combined output from node 70, through the single differential amplifier 124, instrumentation amplifier 120 may provide all the advantages of using two outputs that are each based on combining two outputs as discussed above, while instrumentation amplifier 120 may also reduce the common mode output signals due to resistor or TOTA output mismatches.

Figure 7A:
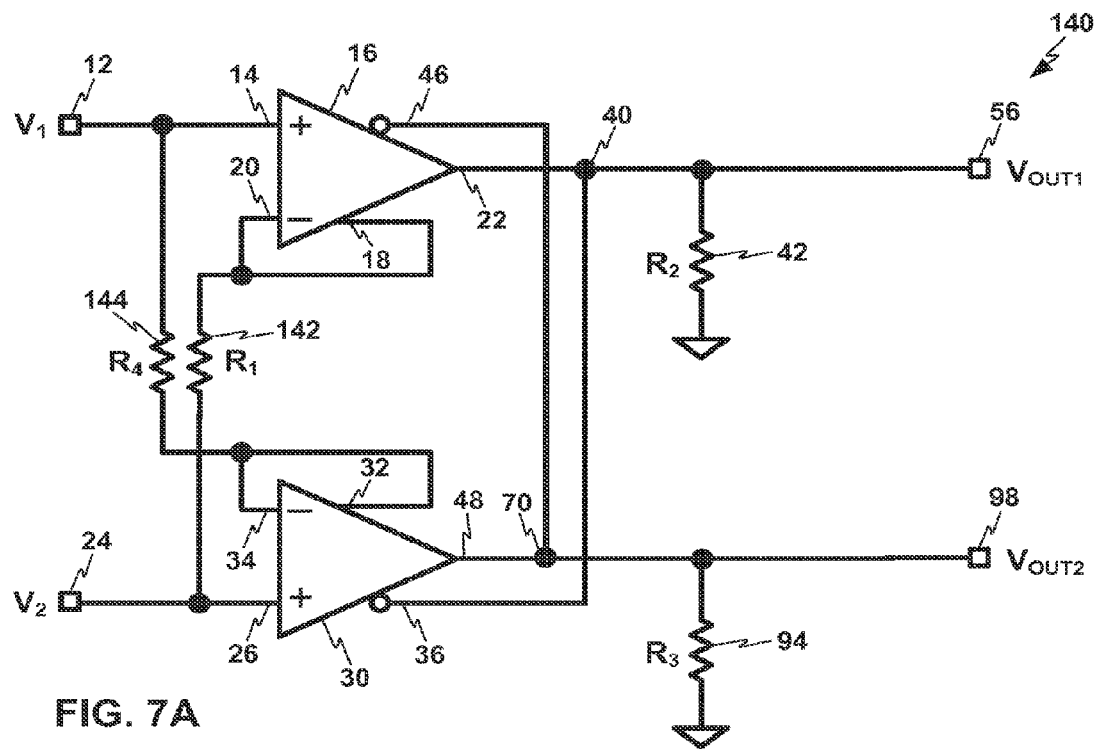
FIG. 7A is a circuit diagram of an instrumentation amplifier implemented with two triple-output transconductance amplifiers and two outputs, in accordance with another illustrative embodiment of this disclosure.
Figure 7B:
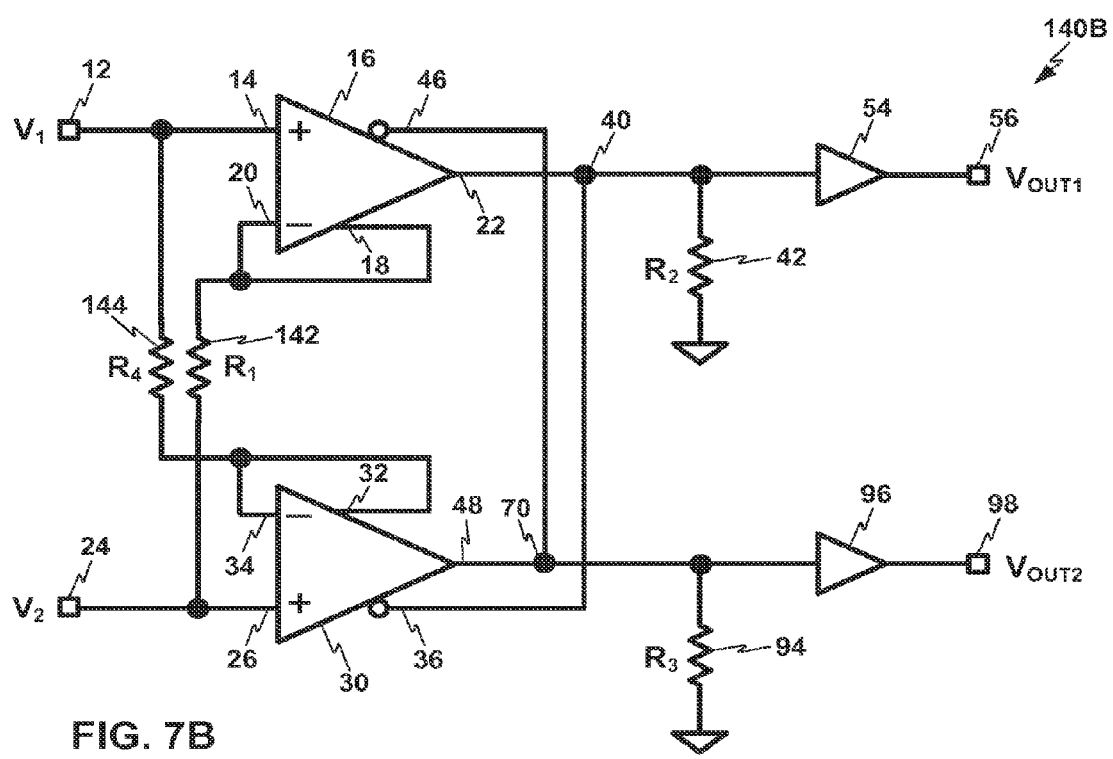
FIG. 7B is a circuit diagram of an instrumentation amplifier implemented with two triple-output transconductance amplifiers and two outputs with non-inverting buffers, in accordance with another illustrative embodiment of this disclosure.
Figure 8:
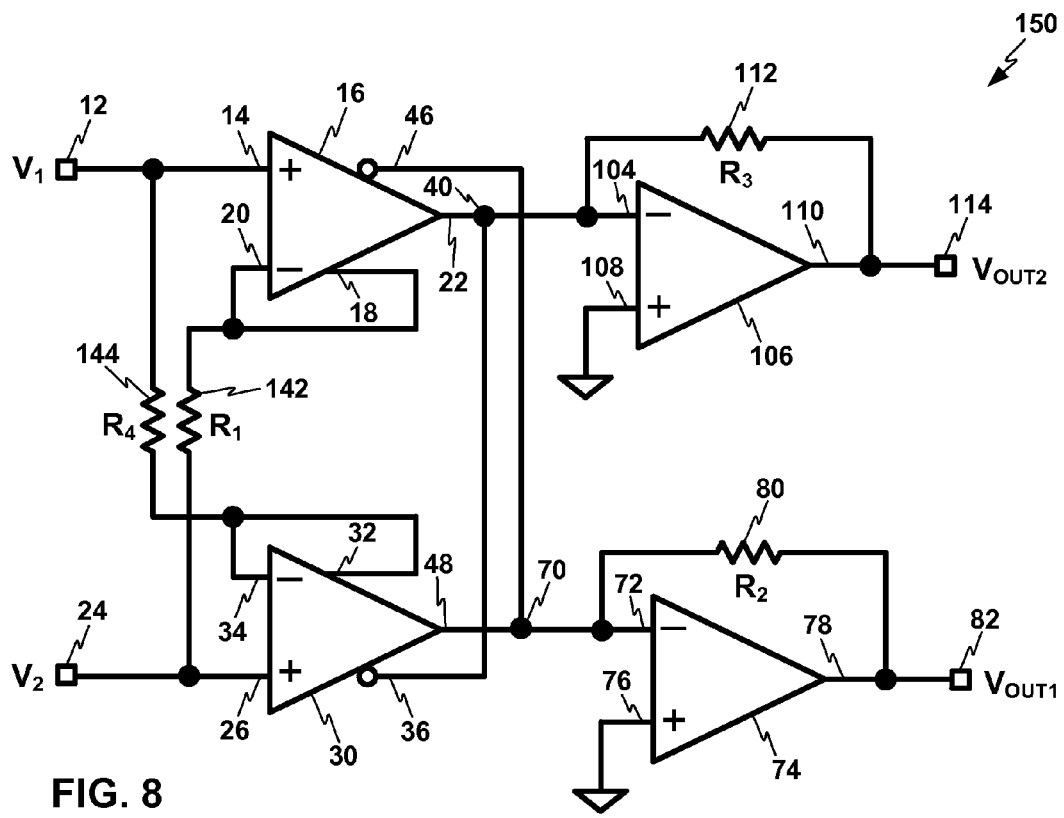
FIG. 8 is a circuit diagram of an instrumentation amplifier implemented with two triple-output transconductance amplifiers and two outputs with inverting buffers, in accordance with another illustrative embodiment of this disclosure.
Figure 9:
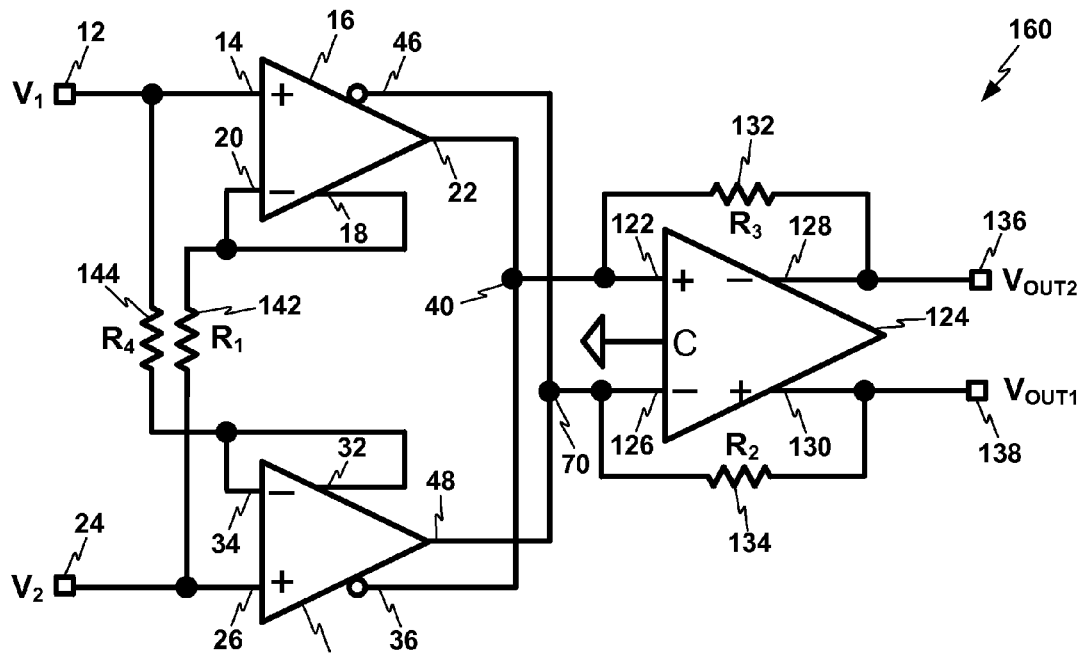
FIG. 9 is a circuit diagram of an instrumentation amplifier implemented with two triple-output transconductance amplifiers, a differential amplifier, and two outputs, in accordance with another illustrative embodiment of this disclosure.

FIG. 7A is a circuit diagram of another example instrumentation amplifier 140 implemented with two TOTAs 16 and 30 and two outputs 56 and 98, similar to instrumentation amplifier 90 of FIG. 4A. FIG. 7B is a circuit diagram of another example instrumentation amplifier 140B implemented with two TOTAs 16 and 30 and two outputs with non-inverting buffers 54 and 96, similar to instrumentation amplifier 90B of FIG. 4B. FIG. 8 is a circuit diagram of example instrumentation amplifier 150 implemented with TOTAs 16 and 30 and two outputs with amplifiers 106 and 74, which may be operational amplifiers or OTAs and which are configured as inverting buffers, similar to instrumentation amplifier 100 of FIG. 5. FIG. 9 is a circuit diagram of example instrumentation amplifier 160 implemented with TOTAs 16 and 30, differential amplifier 124, and two outputs, similar to instrumentation amplifier 120 of FIG. 6. Instrumentation amplifiers 140, 140B, 150, and 160 differ from their counterparts from FIGS. 4A, 5, and 6 by replacement of resistor 38 with an arrangement of two resistors 142 and 144.

While resistor 38 is connected to inverting inputs of both TOTAs 16 and 30 in the examples of FIGS. 4A, 4B, 5, and 6, resistors 142 and 144 have a different arrangement in the examples of FIGS. 7A, 7B, 8, and 9. Resistor 142 is connected at one end with inverting input 20 of first TOTA 16 and connected at the other end with non-inverting input 26 of second TOTA 30. Similarly, resistor 144 is connected at one end with inverting input 34 of second TOTA 30 and connected at the other end with non-inverting input 14 of first TOTA 16.

Instrumentation amplifiers 140, 140B, 150, and 160 of FIGS. 7A, 7B, 8, and 9 may provide various advantages in certain contexts. For example, instrumentation amplifiers 140, 140B, 150, and 160 may be particularly suitable in at least some applications where low noise is important.

The differential gain of instrumentation amplifiers 140, 140B, 150, and 160 is described by equation 5:

$$\frac{V_{OUT1}-V_{OUT2}}{(V_1-V_2)}=[(R_2/R_1)+(R_2/R_4)+(R_3/R_1)+(R_3/R_4)] \quad \text{(Eq. 5)}$$

Additionally, in the special case where $R_2=R_3$ and $R_1=R_4$, equation 5 reduces to equation 6:

$$V_{OUT1}-V_{OUT2}=4(R_2/R_1)(V_1-V_2) \quad \text{(Eq. 6)}$$

In each of the examples of FIGS. 1-4, 4B, 5-7, 7B, 8, and 9, the output voltage terminals are downstream of the connecting nodes 40, 70 that each connect two outputs of DOTAs or TOTAs together. The output voltage terminals may be connected downstream of node 40 and/or 70 either by a direct connection as in the example of FIGS. 1, 4, and 7, or through a buffer or differential amplifier as in the examples of FIGS. 2, 3, 4B-6, 7B, 8, and 9.

Figure 10:
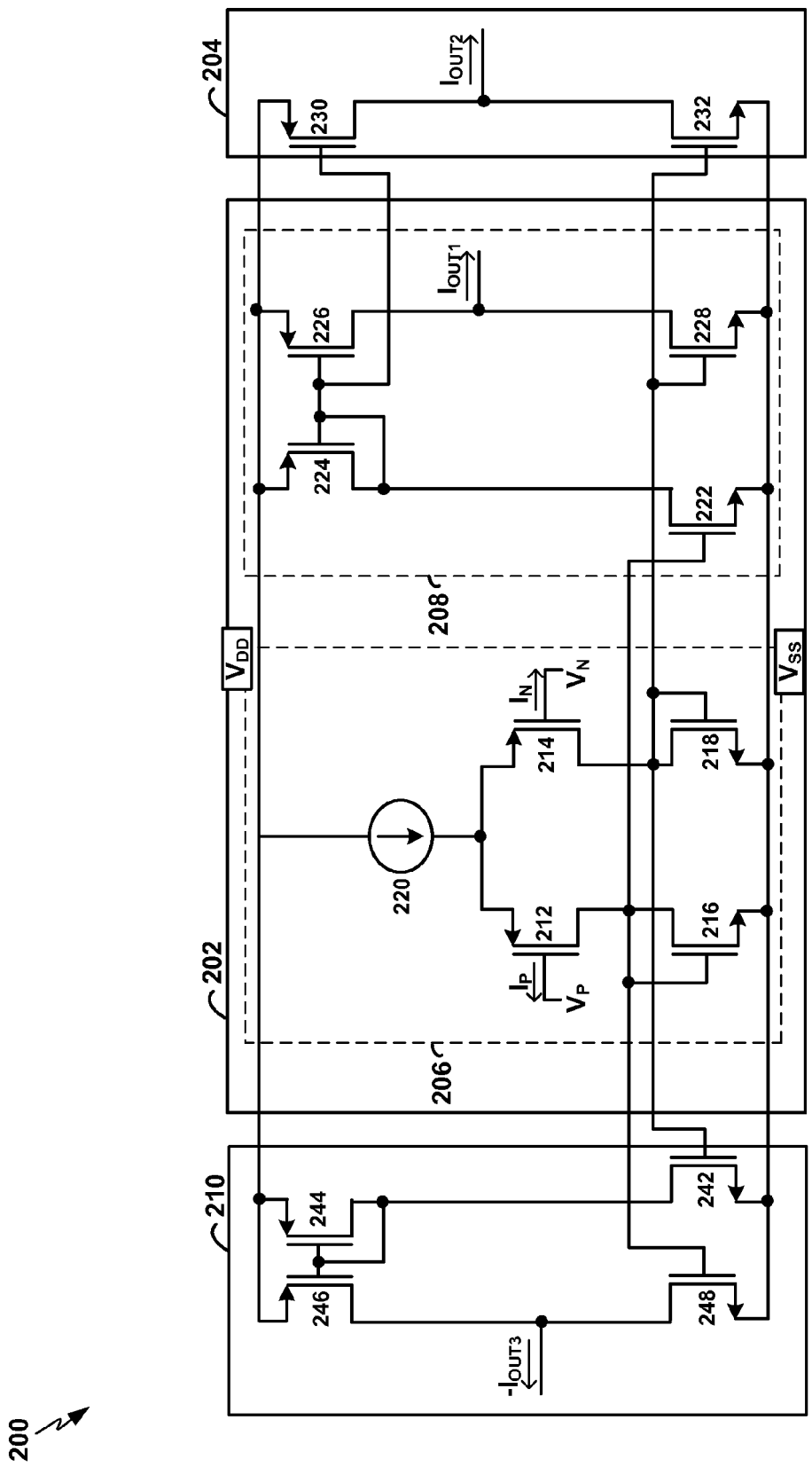
FIG. 10 is a schematic diagram of an illustrative example implementation of a triple-output transconductance amplifier that may be incorporated in an instrumentation amplifier, in accordance with an illustrative embodiment of this disclosure.

FIG. 10 is a schematic diagram of an illustrative example implementation of a TOTA 200 that may be incorporated in an instrumentation amplifier, in accordance with an illustrative embodiment of this disclosure. The schematic diagram of FIG. 10 gives a detailed example at the level of individual transistors how a TOTA or DOTA of FIGS. 1-9 may be implemented. For example, the implementation of TOTA 200 as shown in FIG. 10 may be used for any of the TOTAs 16, 30 of FIGS. 2-9. TOTA 200 as shown in FIG. 10 may also be used in place of either of the DOTAs 15, 29 of FIG. 1 by using two outputs of each TOTA, as discussed above. DOTAs 15, 29 of FIG. 1 may also be implemented as DOTAs that are otherwise analogous to TOTA 200. Details on the operation and construction of a TOTA are also given in U.S. Pat. No. 8,081,030. This schematic diagram represents only one of many possible implementations of a TOTA.

In the implementation of FIG. 10, TOTA 200 includes a differential amplifier circuit 202, a non-inverting output stage 204, and an inverting output stage 210. TOTA 200 may be coupled to a first voltage supply $V_{DD}$ that may supply a positive or high voltage and a second voltage supply $V_{SS}$ that may supply a negative or low or ground voltage. Different implementations of TOTA 200 may use voltage supplies $V_{DD}$ and $V_{SS}$ that may supply different voltage values, including voltages with opposite polarities, with corresponding changes in the types of transistors used as elements of TOTA 200. Thus, while various transistors are depicted in FIG. 10 as PMOS transistors or NMOS transistors, in an implementation that uses voltage supplies of opposite polarity, the PMOS transistors may also be changed to NMOS transistors and vice versa.

The differential amplifier circuit 202 may be any differential amplifier circuit with an input stage that accepts two inputs and an output stage that provides a current output. As shown, the differential amplifier circuit 202 of FIG. 10 may include an input stage 206 and an output stage 208. Differential amplifier circuit 202 may include other stages and components as well.

As shown, the input stage 206 of differential amplifier 202 may include four field effect transistors, including a first transistor 212, a second transistor 214, a third transistor 216, and a fourth transistor 218, as well as a current source 220. The first transistor 212, which is preferably a PMOS transistor, may have a source coupled to the first voltage supply $V_{DD}$ via the current source 220, a drain coupled to a drain of the third transistor 216, and a gate that acts as the positive input of the differential amplifier 202. Similarly, the second transistor 214, which is preferably a PMOS transistor, may have a source coupled to the first voltage supply $V_{DD}$ via the current source 220, a drain coupled to a drain of the fourth transistor 218, and a gate that acts as the negative input of the differential amplifier 202. The third transistor 216, which is preferably an NMOS transistor, may have a drain coupled to the drain of the first transistor 212, a source coupled to the second voltage supply $V_{SS}$, and a gate coupled to its own drain. Similarly, the fourth transistor 218, which is preferably an NMOS transistor, may have a drain coupled to the drain of the second transistor 214, a source coupled to the second voltage supply $V_{SS}$, and a gate coupled to its drain. As shown, the gate/drain of the third transistor 216 may act as a first output of the input stage 206, and the gate/drain of the fourth transistor 218 may act as a second output of the input stage 206.

The output stage 208 of differential amplifier 202 may also include four transistors, including a fifth transistor 222, a sixth transistor 224, a seventh transistor 226, and an eighth transistor 228. The fifth transistor 222, which is preferably an NMOS transistor, may have a source coupled to the second voltage supply $V_{SS}$, a drain coupled to a drain of the sixth transistor 224, and a gate coupled to the first output of the input stage 206 of differential amplifier 202. The sixth transistor 224, which is preferably a PMOS transistor, may have a source coupled to the first voltage supply $V_{DD}$, a drain coupled to the drain of the fifth transistor 222, and a gate coupled to its own drain. The seventh transistor 226, which is preferably a PMOS transistor, may have a source coupled to the first voltage supply $V_{DD}$, a drain coupled to a drain of the eighth transistor 228, and a gate coupled to the gate/drain of the sixth transistor 224. The eighth transistor 228, which is preferably an NMOS transistor, may have a drain coupled to the drain of the seventh transistor 226, a source coupled to the second voltage supply $V_{SS}$, and a gate coupled to the second output of input stage 206 of differential amplifier 202. As shown, the coupled drains of the seventh transistor 226 and the eighth transistor 228 may then act as the current output of the output stage 208. Thus, the coupled drains of the seventh transistor 226 and the eighth transistor 228 may then also serve as the first current output of TOTA 200, providing a first output current $I_{OUT1}$.

The non-inverting output stage 204 of TOTA 200 may function to provide a second current output with substantially the same amplitude and phase as the current output of the differential amplifier circuit 202 of TOTA 200, such as by replicating the output stage 208 of the differential amplifier circuit 202 of TOTA 200. In this respect, to replicate the output stage 208 of differential amplifier 202, the non-inverting output stage 204 may be a push-pull output stage that includes two transistors, a first transistor 230 and a second transistor 232. The first transistor 230 and second transistor 232 may have substantially the same characteristics, and be placed in substantially the same configuration, as the seventh and eighth transistors 226 and 228 of the differential amplifier circuit 202.

In particular, the first transistor 230, which is preferably a PMOS transistor, may have a source coupled to the first voltage supply $V_{DD}$, a drain coupled to a drain of the second transistor 232, and a gate coupled to the gate/drain of the sixth transistor 224. The second transistor 232, which is preferably an NMOS transistor, may have a drain coupled to the drain of the first transistor 230, a source coupled to the second voltage supply $V_{SS}$, and a gate coupled to the second output of the input stage 206 of differential amplifier circuit 202. As shown, the coupled drains of the first transistor 230 and second transistor 232 may then act as the current output of the non-inverting output stage 204 of TOTA 200. Thus, the coupled drains of the first transistor 230 and second transistor 232 may then also serve as the second current output of the TOTA 200, providing a second output current $I_{OUT2}$.

The inverting output stage 210 of TOTA 200 may then function to provide a third current output with substantially the same amplitude as the first and second current outputs $I_{OUT1}$ and $I_{OUT2}$, but with a substantially opposite polarity to the first and second current outputs. As shown, the inverting output stage 210 may include four transistors, including a first transistor 242, a second transistor 244, a third transistor 246, and a fourth transistor 248.

The first transistor 242, which is preferably an NMOS transistor, may have a source coupled to the second voltage source $V_{SS}$, a drain coupled to a drain of the second transistor 244, and a gate coupled to the second output of the input stage 206 of differential amplifier circuit 202. The second transistor 244, which is preferably a PMOS transistor, may have a source coupled to the first voltage supply $V_{DD}$, a drain coupled to the drain of the first transistor 242, and a gate coupled to its own drain. The third transistor 246, which is preferably a PMOS transistor, may have a source coupled to the first voltage supply $V_{DD}$, a drain coupled a drain of the fourth transistor 248, and a gate coupled to the gate/drain of the second transistor 244. The fourth transistor 248, which is preferably an NMOS transistor, may have a source coupled to the second voltage source $V_{SS}$, a drain coupled to the drain of the third transistor 246, and a gate coupled to the first output of the input stage 206 of differential amplifier circuit 202.

As shown, the coupled drains of the third transistor 246 and the fourth transistor 248 may then act as the current output of the inverting output stage 210. Thus, the coupled drains of the third transistor 246 and the fourth transistor 248 may also serve as the third current output of the TOTA 200, providing a third output current $-I_{OUT}$, of substantially the same amplitude but opposite polarity of the first and second output currents $I_{OUT1}$ and $I_{OUT2}$. TOTA 200 may therefore provide three outputs with current of substantially the same amplitude, in which two of the three outputs are non-inverted outputs and one of the outputs is an inverted output. Suitable variations on the elements of TOTA 200 as described above may be made to accommodate other forms of TOTAs and DOTAs and provide other combinations of non-inverted and/or inverted current outputs for other implementations of an instrumentation amplifier as described above.

The circuit components described in this disclosure can be implemented as discrete components, as one or more elements of one or more integrated devices, or any combination thereof. The circuit components described herein may be fabricated using any of a wide variety of process technologies including CMOS process technologies and bipolar junction transistor (BJT) process technologies. In addition, the circuitry described herein may be used in various applications including instrumentation, industrial control, medical applications, or any other application that may make use of an instrumentation amplifier.

Various aspects of the disclosure have been described. These and other aspects are within the scope of the following claims.

What is claimed is:

1. A device comprising:
  a first multiple-output transconductance amplifier that comprises a non-inverting input, an inverting input, a first non-inverted output, and a second non-inverted output, wherein the first non-inverted output is connected to the inverting input, and the non-inverting input is connected to a first input voltage terminal;
  a second multiple-output transconductance amplifier that comprises a non-inverting input, an inverting input, a first non-inverted output, and an inverted output, wherein the first non-inverted output is connected to the inverting input, and the non-inverting input is connected to a second input voltage terminal;
  a first resistor, wherein a first end of the first resistor is connected to the inverting input of the first multiple-output transconductance amplifier, and a second end of the first resistor is connected to the inverting input of the second multiple-output transconductance amplifier;
  a second resistor, wherein a first end of the second resistor is connected to both the second non-inverted output of the first multiple-output transconductance amplifier and the inverted output of the second multiple-output transconductance amplifier, and a second end of the second resistor is connected to ground if the first end of the second resistor has a non-inverted input, or to an amplifier output node of an amplifier if the first end of the second resistor has an inverted input; and
  a first output voltage terminal connected to both the second non-inverted output of the first multiple-output transconductance amplifier and the inverted output of the second multiple-output transconductance amplifier.

2. The device of claim 1, wherein the first multiple-output transconductance amplifier and the second multiple-output transconductance amplifier are triple-output transconductance amplifiers.

3. The device of claim 1, further comprising:
  a first node connected to both the second non-inverted output of the first multiple-output transconductance amplifier and the inverted output of the second multiple-output transconductance amplifier; and
  a non-inverting output buffer connected between the first node and the first output voltage terminal.

4. The device of claim 1, further comprising:
  a first node connected to both the inverted output of the first multiple-output transconductance amplifier and the second non-inverted output of the second multiple-output transconductance amplifier; and
  an inverting output buffer connected between the first node and the first output voltage terminal.

5. The device of claim 4, further wherein the inverting output buffer comprises an operational transconductance amplifier and the second resistor.

6. The device of claim 1, wherein the first multiple-output transconductance amplifier further comprises an inverted output and the second multiple-output transconductance amplifier further comprises a second non-inverted output, and the device comprises a second output voltage terminal connected to both the inverted output of the first multiple-output transconductance amplifier and the second non-inverted output of the second multiple-output transconductance amplifier.

7. The device of claim 6, further comprising:
a second node connected to both the inverted output of the first multiple-output transconductance amplifier and the second non-inverted output of the second multiple-output transconductance amplifier; and
a non-inverting output buffer connected between the second node and the second output voltage terminal.

8. The device of claim 6, further comprising:
a second node connected to both the inverted output of the first multiple-output transconductance amplifier and the second non-inverted output of the second multiple-output transconductance amplifier; and
an inverting output buffer connected between the second node and the second output voltage terminal.

9. The device of claim 8, further wherein the inverting output buffer comprises an operational transconductance amplifier and the second resistor.

10. The device of claim 6, further comprising:
a first node connected to both the second non-inverted output of the first multiple-output transconductance amplifier and the inverted output of the second multiple-output transconductance amplifier;
a second node connected to both the inverted output of the first multiple-output transconductance amplifier and the second non-inverted output of the second multiple-output transconductance amplifier; and
a differential amplifier with a non-inverting input and an inverting input, wherein the first node is connected to the non-inverting input and the second node is connected to the inverting input.

11. An integrated circuit comprising:
a first triple-output transconductance amplifier that comprises a non-inverting input, an inverting input, a first non-inverted output, a second non-inverted output, and an inverted output, wherein the first non-inverted output is connected to the inverting input, and the non-inverting input is connected to a first input voltage terminal;
a second triple-output transconductance amplifier that comprises a non-inverting input, an inverting input, a first non-inverted output, a second non-inverted output, and an inverted output, wherein the first non-inverted output is connected to the inverting input, and the non-inverting input is connected to a second input voltage terminal;
a first node connected to both the second non-inverted output of the first multiple-output transconductance amplifier and the inverted output of the second multiple-output transconductance amplifier;
a second node connected to both the inverted output of the first multiple-output transconductance amplifier and the second non-inverted output of the second multiple-output transconductance amplifier;
a first resistor connected to the inverting input of the first triple-output transconductance amplifier and the inverting input of the second triple-output transconductance amplifier;
a second resistor, wherein a first end of the second resistor is connected to the first node;
a third resistor, wherein a first end of the third resistor is connected to the second node;
a first output voltage terminal, downstream of the first node; and
a second output voltage terminal, downstream of the second node.

12. The integrated circuit of claim 11, wherein a second end of the second resistor is connected to ground and a second end of the third resistor is connected to ground, the first end of the second resistor is connected to the first node and a first non-inverting buffer, and the first end of the third resistor is connected to the second node and a second non-inverting buffer.

13. The integrated circuit of claim 11, further comprising:
a first inverting buffer comprising a first operational transconductance amplifier, wherein the first node is connected to an inverting input of the first operational transconductance amplifier, and the second resistor is connected between the inverting input of the first operational transconductance amplifier and an output of the first operational transconductance amplifier; and
a second inverting buffer comprising a second operational transconductance amplifier, wherein the second node is connected to an inverting input of the second operational transconductance amplifier, and the third resistor is connected between the inverting input of the second operational transconductance amplifier and an output of the second operational transconductance amplifier.

14. The integrated circuit of claim 11, further comprising:
a differential amplifier comprising a non-inverting input and an inverting input, wherein the first node is connected to the non-inverting input of the differential amplifier and the second node is connected to the inverting input of the differential amplifier, the second resistor is connected between the non-inverting input of the differential amplifier and a first output of the differential amplifier, and the third resistor is connected between the inverting input of the differential amplifier and a second output of the differential amplifier.

15. The integrated circuit of claim 11, wherein the third resistor is connected to the inverting output of the second triple-output transconductance amplifier.

16. The integrated circuit of claim 11, wherein the first triple-output transconductance amplifier and the second triple-output transconductance amplifier each comprise a differential amplifier circuit, a non-inverting output stage, and an inverting output stage, and are implemented using a plurality of PMOS transistors and a plurality of NMOS transistors.

17. An integrated circuit comprising:
a first triple-output transconductance amplifier that comprises a non-inverting input, an inverting input, a first non-inverted output, a second non-inverted output, and an inverted output, wherein the first non-inverted output is connected to the inverting input, and the non-inverting input is connected to a first input voltage terminal;
a second triple-output transconductance amplifier that comprises a non-inverting input, an inverting input, a first non-inverted output, a second non-inverted output, and an inverted output, wherein the first non-inverted output is connected to the inverting input, and the non-inverting input is connected to a second input voltage terminal;
a first node connected to both the second non-inverted output of the first multiple-output transconductance amplifier and the inverted output of the second multiple-output transconductance amplifier;

a second node connected to both the inverted output of the first multiple-output transconductance amplifier and the second non-inverted output of the second multiple-output transconductance amplifier;

a first resistor connected to the inverting input of the first triple-output transconductance amplifier and the non-inverting input of the second triple-output transconductance amplifier;

a second resistor connected to the inverting input of the second triple-output transconductance amplifier and the non-inverting input of the first triple-output transconductance amplifier;

a third resistor, wherein a first end of the third resistor is connected to the first node;

a fourth resistor, wherein a first end of the fourth resistor is connected to the second node;

a first output voltage terminal, downstream of the first node; and a second output voltage terminal, downstream of the second node.

18. The integrated circuit of claim 17, wherein a second end of the third resistor is connected to ground and a second end of the fourth resistor is connected to ground, the first end of the third resistor is connected to the first node and a first non-inverting buffer, and the second end of the fourth resistor is connected to the second node and a second non-inverting buffer.

19. The integrated circuit of claim 17, further comprising:

a first inverting buffer comprising a first operational transconductance amplifier, wherein the first node is connected to an inverting input of the first operational transconductance amplifier, and the third resistor is connected between the inverting input of the first operational transconductance amplifier and an output of the first operational transconductance amplifier; and a second inverting buffer comprising a second operational transconductance amplifier, wherein the second node is connected to an inverting input of the second operational transconductance amplifier, and the fourth resistor is connected between the inverting input of the second operational transconductance amplifier and an output of the second operational transconductance amplifier.

20. The integrated circuit of claim 17, further comprising:

a differential amplifier comprising a non-inverting input and an inverting input, wherein the first node is connected to the non-inverting input of the differential amplifier and the second node is connected to the inverting input of the differential amplifier, the third resistor is connected between the non-inverting input of the differential amplifier and a first output of the differential amplifier, and the fourth resistor is connected between the inverting input of the differential amplifier and a second output of the differential amplifier.

* * * * *